United States Patent [19]

Even-or et al.

[11] Patent Number: 4,808,859
[45] Date of Patent: Feb. 28, 1989

[54] BROADBAND ELECTRONIC SWITCH

[75] Inventors: Baruch Even-or, Chalfont; Robert L. Rauck, Hatfield, both of Pa.

[73] Assignee: American Electronic Laboratories, Inc., Lansdale, Pa.

[21] Appl. No.: 1,947

[22] Filed: Jan. 9, 1987

[51] Int. Cl.[4] ............... H03K 17/60; H03K 17/687
[52] U.S. Cl. ................... 307/571; 307/577; 307/572; 307/542; 307/499
[58] Field of Search .............. 307/570, 571, 572, 577, 307/242, 542, 575, 243, 574, 584, 499, 501, 254, 256, 240, 573

[56] References Cited

U.S. PATENT DOCUMENTS

| 3,215,859 | 11/1965 | Sorchych. | |
|---|---|---|---|
| 4,371,797 | 1/1983 | Frank | 307/577 |
| 4,487,458 | 12/1984 | Janutka | 307/499 |
| 4,540,893 | 9/1985 | Bloomer | 307/571 |
| 4,595,847 | 6/1986 | Weir | 307/574 |
| 4,649,302 | 3/1987 | Damiano et al. | 307/571 |
| 4,672,246 | 6/1987 | Donovan | 307/572 |

OTHER PUBLICATIONS

"Reverse Bias Over-Current Protection for Power Field-Effect Transistors", IBM Tech. Bulletin, vol. 29, No. 2, Jul. 1986, pp. 567-569.

Primary Examiner—John S. Heyman
Assistant Examiner—Timothy P. Callahan
Attorney, Agent, or Firm—Seidel, Bonda, Lavorgna & Monaco

[57] ABSTRACT

A broadband electronic switch has first and second field-effect transistors connected in common-source cascade configuration defining a signal path for a signal to be switched from the drain electrode of the first transistor through the common-source connection to the drain electrode of the second transistor. Each transistor has a conductive state and a non-conductive state. A reverse recovery diode is connected from the source electrode to the drain electrode of each transistor. The switch includes a switch control coupled to the first and second transistors for selectably placing both transistors in the conductive and non-conductive states. The switch control has non-inductive elements for attenuating signal leakage from the signal path into the switch control when the transistors are in the non-conductive state and for minimizing transistor parasitic capacitances during transition from the conductive to non-conductive states to minimize transition time.

5 Claims, 8 Drawing Sheets

BROADBAND ELECTRONIC SWITCH

FIELD OF THE INVENTION

The present invention is a broadband electronic switch, and in particular is directed to a broadband, high power, high speed, low loss electronic switch.

BACKGROUND OF THE INVENTION

Secure communications requirements in the HF frequency range (1 MHz to 30 MHz) have led to the development of frequency-hopping (FA) transmitters and associated FA jammers. Both communication and jamming FA transmitters utilize broadband (full HF coverage and more) amplifiers. However, such transmitters are faced with two major limiting problems, namely harmonics generated by the amplifier and transmitting antenna mismatch over the frequency range.

Prior solutions to the above problems are, respectively, utilization of rapidly switched high power harmonic suppression filters and utilization of rapidly switched high power antenna tuning elements. A key requirement for both solutions is a broadband, high power, high speed, low loss solid state switch that introduces very low harmonics.

The present invention is directed to a twenty octave (30 Hz to 30 MHz), high power (1500 W) inductorless switch which provides particularly low power loss and low harmonic levels at a 1500 W CW level at the HF frequency range.

SUMMARY OF THE INVENTION

The present invention is a braodband electronic switch comprising first and second solid state witch means in series with a signal path for a signal to be switched, each switch means having an open state and a closed state. Means operatively associated with each switch means reduce the ohmic resistance of the switch means in the closed state. Switch control means operatively associated with each switch means selectably places both switch means in the open and closed states. The switch control means has non-inductive means for attenuating signal leakage from the signal path into the switch control means when the switch means are in the open state and for minimizing transition time between the switch means open and closed states.

In a preferred embodiment, the invention comprises first and second field-effect transistors connected in common-source cascade configuration defining a signal path for a signal to be switched from the drain electrode of the first transistor through the common-source connection to the drain electrode of the second transistor, each transistor having a conductive state and a non-conductive state. A reverse-recovery diode is connected from the source electrode to the drain electrode of each transistor, A switch control means is coupled to the first and second transistors for selectably placing both transistors in the conductive and non-conductive states. The switch control means has non-inductive means for attenuating signal leakage from the signal path into the switch control means when the transistors are in the non-conductive state and for minimizing transistor parasitic capacitances during transition from the conductive to non-conductive states to minimize transition time.

DESCRIPTION OF THE DRAWINGS

For the purpose of illustrating the invention, there is shown in the drawings a form which is presently preferred; it being understood, however, that this invention is not limited to the precise arrangements and instrumentalities shown.

DESCRIPTION OF THE INVENTION

Figure 1:
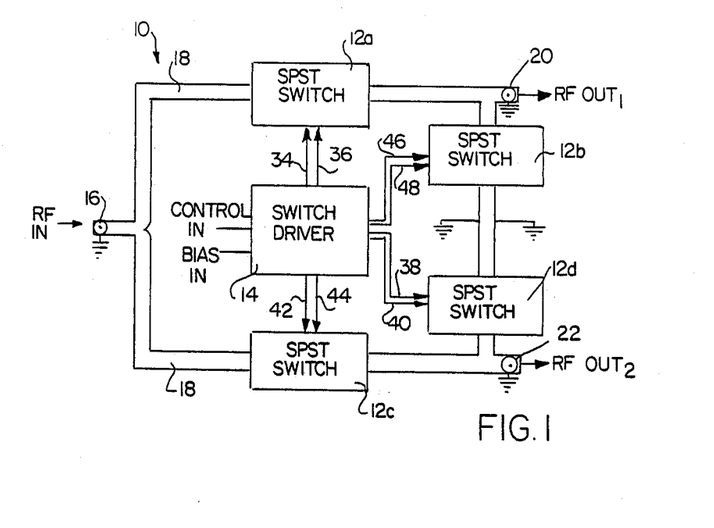
FIG. 1 is a simplified block diagram of a single-pole, double-throw switch constructed using a plurality of broadband electronic single-pole, single-throw switch elements in accordance with the present invention.

Referring now to the drawings, wherein like numerals indicate like elements, there is shown in FIG. 1 a single-pole, double-throw switch 10 constructed from individual single-pole, single-throw switch elements 12a through 12d Each single-pole, single-throw switch element 12 is individually controlled by a common switch driver 14. Single-pole, single-throw switch elements 12 and switch driver 14 will each be described in greater detail below.

Single-pole, double-throw switch 10 may be connected to a source of RF signals to be switched, as at 16, by RF transmission lines 18. Transmission lines 18 connect the source of RF signals to two parallel series/shunt switch arrangements to provide first and second switched RF outputs 20 and 22, respectively. As will be appreciated by those skilled in the art, by selectably and alternately opening one of the series switches and closing the associated shunt switch, while closing the other series switch and opening its associated shunt switch, the RF input can be switched between RF outputs 20 and 22 as desired. RF outputs 20 and 22 are typically connected to a 50 ohm load (not shown).

Although the present invention is illustrated in connection with the single-pole, double-throw switch of FIG. 1, individual single-pole, single-throw switch elements 12 may be connected in other configurations such as a single series/shunt switch, an n-stage series/series switch configuration, a series/series/shunt configuration and a series/shunt/series configuration.

Figure 2:
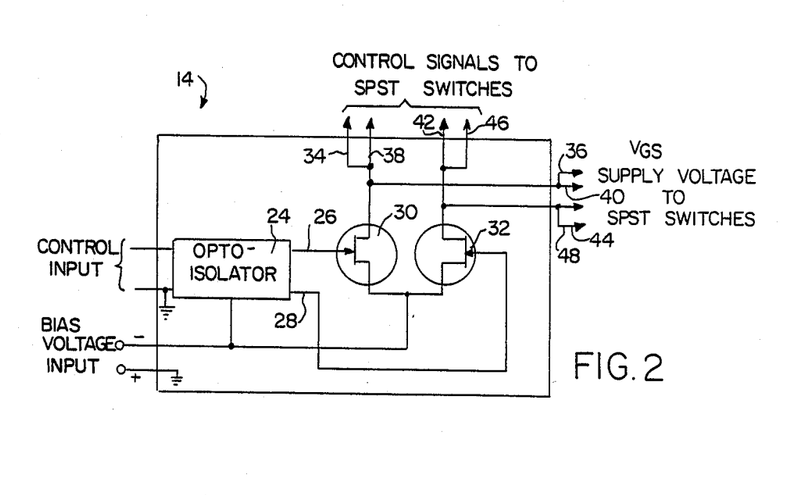
FIG. 2 is a simplified diagram of a switch control means according to the present invention.

Switch driver 14 is shown in somewhat greater detail in FIG. 2. Switch driver 14 comprises an optoelectronic isolator 24 which receives switch control inputs, which may, but need not, be in the form of a TTL pulse. For example, a TTL "1" can indicate that the signal is to be switched to RF output 20, while a TTL "0" can indicated that the signal is to be switched to RF output 22. However, instead of TTL pulses, any other suitable control input or voltage level can be used to control switch operation. As will become apparent to those skilled in the art, optoisolator 24 is necessary to couple relatively low-level control inputs to very high level control and supply voltages provided by switch driver 14 to individual single-pole, single-throw switch elements 12. Of course, as those skilled in the art will recognize, any other suitable isolation techniques may be employed without departing from the scope of the present invention. Optoisolator is preferably RF shielded to minimize its RF sensitivity.

In response to the control inputs, optoisolator 24 generates control outputs on lines 26 and 28 which are used to switch high-voltage field-effect transistors 30 and 32 respectively. As shown in FIG. 2, field-effect transistors (FETs) 30 and 32 are connected in common-source mode, with the common source terminals being connected to a bias input voltage. Bias input voltage is a deep negative voltage, preferably on the order of −650 volts. The source electrode of each FET 30 and 32 respectively provides control signals and VGS supply voltages to one of the two series/shunt switch configurations of switch 10.

Operation of switch driver 14 can be readily understood with reference to FIG. 2.

For purposes of illustration, it will be assumed that the RF input at 16 is to be switched to RF output 20, which will require closing switch elements 12a and 12d and opening switch elements 12b and 12c, shown in FIG. 1. Further assuming that a TTL "1" control input to optoisolator 24 is the appropriate control signal to achieve this switching function, the TTL "1" applied to optoisolator 24 will result in signals on optoisolator output lines 26 and 28 to turn FET 30 on and turn FET 32 off. By turning FET 30 on, the bias voltage input to switch driver 14 is applied via switch driver output lines 34, 36, 38 and 40, to close switch elements 12a and 12d. The manner in which these outputs are used to close SPST switch elements 12 will be described in greater detail below. At the same time, by turning FET 32 off, the bias voltage input to switch driver 14 is removed from switch driver output lines 42, 44, 46 and 48, thereby opening switches 12b and 12c.

Conversely, to open switches 12a and 12d and close switches 12b and 12c, a TTL "0" control input will cause FET 30 to be turned off, opening switches 12a and 12d, and will cause FET 32 to be turned on, closing switches 12b and 12c.

Figure 3:
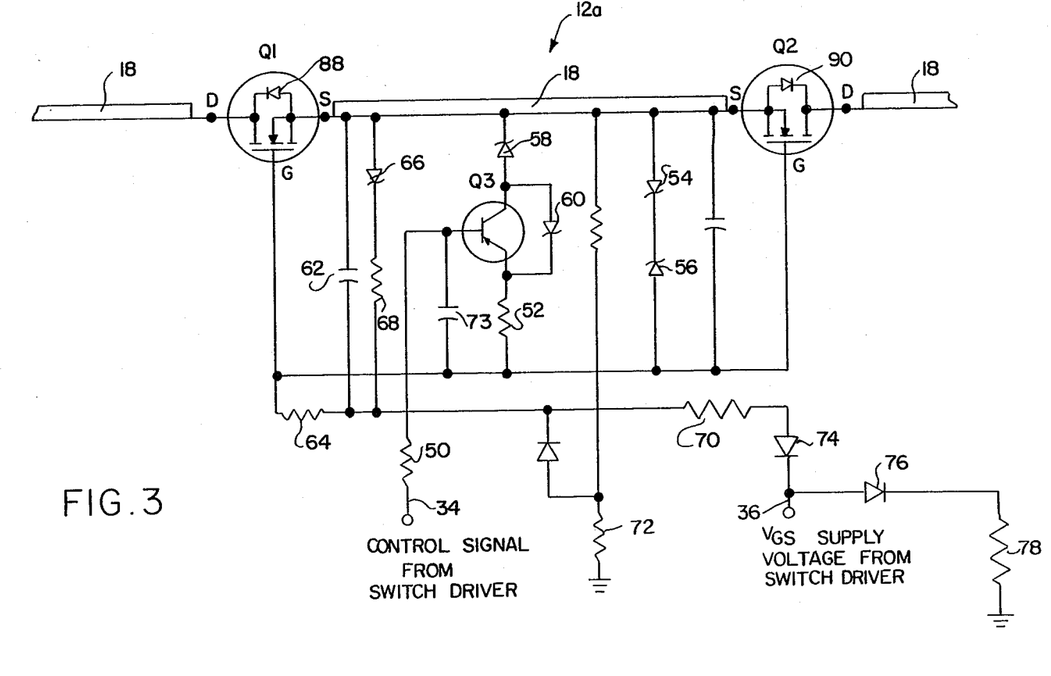
FIG. 3 is a schematic diagram of a single-pole, single-throw switch element of FIG. 1 in accordance with the present invention.

Referring now to FIG. 3, there is shown a single-pole, single-throw switch element 12a, it being understood that switch elements 12b, 12c and 12d are identical to switch element 12a. Each single-pole, single-throw switch element 12a comprises two power FETs Q1 and Q2 and associated control circuitry driven by the switch driver 14. The control circuitry performs two distinct sequences of operation, the "turn-off" sequence (i.e., transition from "on" state to "off" state) and the "turn-on" sequence (i.e., transition from "off" state to "on" state).

In addition, the control circuitry provides minimal RF power leakage through the driver circuitry in switch driver 14 to ground, provides fast transition time, and maintains reliable switching operation for a wide range of switching rates.

In order to open (i.e., turn off) switch element 12a shown in FIG. 3, it is necessary to short out the gate to source terminals of Q1 and Q2 and apply a high voltage (approximately 500 volts) between the source and drain of Q1 and Q2, with the source negative relative to the drain.

The "turn-off" sequence of single-pole, single-throw switch element 12a, which is conceptually applicable to the other single-pole, single-throw switch elements, is now described.

An incoming positive control signal from switch driver 14 is applied to optoisolator 24 of switch driver 14, resulting in high voltage between the gate and source of FET 30, and connecting the −650 V bias voltage (relative to ground) to lines 34, 36, 38 and 40. The signal on line 34 provides a base current $I_b$ to the bi-polar transistor Q3 via high-impedance resistor 50. Although the emitter of transistor Q3 will typically swing +380 V relative to ground (due to the presence of an assumed RF input of 1500 W), the base current $I_b$ is able to turn on Q3 while maintaining simultaneously low RF leakage and high speed response as follows.

Figure 4:
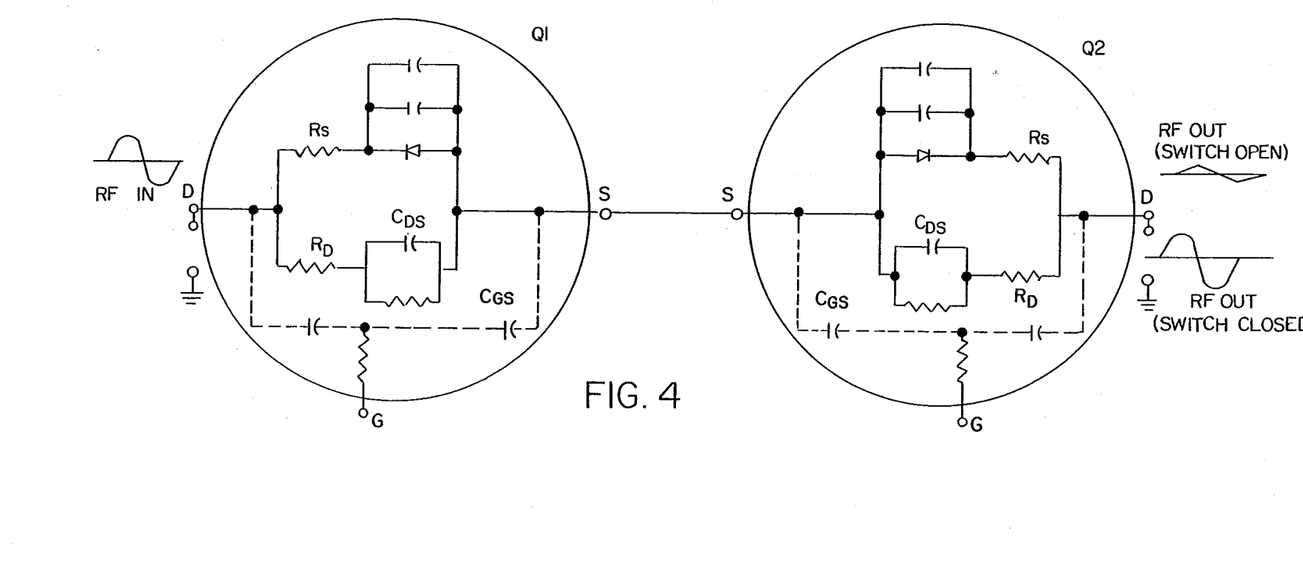
FIG. 4 is an equivalent circuit of the field-effect transistors used as the switching elements in the circuit in FIG. 3.

The large gate-to-source capacitance $C_{gs}$ of Q1 and Q2 (see FIG. 4) is rapidly discharged through low impedance resistor 52 and the low impedance emitter to collector path of Q3 which results when Q3 is turned on by the base current $I_b$ supplied on line 34 from switch driver 14.

As soon as the gate to source capacitance $C_{gs}$ has discharged and the gate to source voltage $V_{gs}$ drops below a threshold of approximately 3 V, both FETs Q1 and Q2 will turn off, exhibiting high dc resistance but still exhibiting low RF impedance since the non-linear drain to source leakage capacitance $C_{ds}$ (see FIG. 4) of Q1 and Q2 is not charged up yet, and its value is inversely proportional to the (so far) low drain to source voltage $V_{ds}$. This results in a high value of $C_{ds}$ and, thus, a low RF impedance.

When FETs Q1 and Q2 are turned off, their high dc resistance $R_d$ and $R_s$ (see FIG. 4) isolates the −650 V bias voltage on line 34 from the load and RF generator impedances, and thus initiates the chargeup of $C_{ds}$ via resistor 50, transistor Q3, resistor 52 and diodes 54 and 56. Since $C_{ds}$ is very small compared to $C_{gs}$, and its value also decreases as the voltage across it increases, the chargeup of $C_{ds}$ via resistor 50 is rapid.

As $C_{ds}$ reaches its steady stage voltage level (typically 500 V), full RF isolation is obtained and the "turn-off" sequence is completed, typically within less than 10 microseconds. Thus, while maintaining a high impedance path to ground through resistor 50 to avoid RF leakage, the switch can be rapidly turned off.

Diode 58 is provided between the collector of transistor Q3 and the RF transmission line 18 to prevent reverse current flow through the base-collector junction of transistor Q3. Reverse current flow through Q3 would interfere with the rapid discharge of $C_{gs}$. Zener diode 60 protects the base-collector junction of transistor Q3 against excessive reverse voltage due to the RF voltage being switched.

When switch element 12a is in the "off" state, capacitor 62 (utilized during "turn on" as a floating power source to rapidly charge up large gate to source capacitance of the FETs Q1 and Q2, as will be described below) is charged up to approximately the same potential as that across resistor 64. This potential also maintains the negative voltage across Zener diode 56, via resistor 64, which keeps FETs Q1 and Q2 turned off after the chargeup of $C_{ds}$ is complete.

The steady state drain-to-source voltage $V_{ds}$ of FETs Q1 and Q2 is established by the resistor network comprising resistors 50, 52, 64, 70 and 72.

A similar sequence of events occurs simultaneously at switch element 12d, to turn it off simultaneously with switch element 12a.

In general, it is preferred that the "turn off" sequence of switch elements 12a and 12d be executed faster than the "turn on" sequence of switch elements 12b and 12c (i.e., "break before make") in order to prevent shorting out the RF signal during the switching transition in the case of "hot switching" (i.e., switching in the presence of RF power). As noted above, while switch elements 12a and 12d are being turned off, switch elements 12b and 12c are being turned on, and vice versa.

In order to close (i.e., turn on) single-pole, single-throw switch element 12a, it is necessary to remove the high voltage bias between the drain-to-source terminals of FETs Q1 and Q2, and apply a positive bias between the gate and source terminals of Q1 and Q2. The "turn-on" sequence of switch element 12a, which is conceptually applicable to the other three switch elements, is now described.

The incoming control signal to the optoisolator 24 is set to TTL "0" and, as a result, the gate-to-source voltage of FET 30 drops below the FET threshold voltage, creating a high resistance between its source and drain. The high source to drain resistance of FET 30 causes its parasitic drain to source capacitance $C_{ds}$ to charge up to the $-650$ V bias voltage, and the potential of lines 34, 36, 38 and 40 drops to virtually zero while still maintaining a high ac impedance to ground. This high ac impedance is established since the parasitic drain to source capacitance $C_{ds}$ has a low value due to the deep negative voltage ($-650$ V) across FET 30. Thus, the RF power leakage to ground through lines 34, 36, 38 and 40 when switch element 12a is in the "on" state (i.e., when full RF power is passing through switch element 12a) is attenuated by the high ac impedance of FET 30 created by the deep negative bias voltage. This arrangement also attenuates RF power leakage into the RF-sensitive optoisolator 24.

As the potential on lines 34, 36, 38 and 40 drops, the current $I_b$ flowing through the base of transistor Q3 via resistor 50 (which is also the biasing current through Zener diode 66 which maintains FET's Q1 and Q2 in the "off" state) is discontinued. The disappearance of $I_b$ reverses the potential across resistor 64, since capacitor 62 will now discharge through resistor 64 rather than charge through it. The discharge current of capacitor 62 now flows into and charges up the large parasitic gate-to-source capacitance $G_{gs}$ of FETs Q1 and Q2. As soon as the gate-to-source threshold voltage of FETs Q1 and Q2 is reached, both Q1 and Q2 turn on, exhibiting low resistance and allowing the RF power to propogate through them. The "turn-on" sequence is thus completed, typically within less than 15 microseconds.

Zener diode 54 maintains the turn-on voltage across the gate-to-source terminals of FETs Q1 and Q2. Capacitor 72 attenuates the RF voltage, due to RF leakage to ground via resistor 50 across the base-emitter junction of transistor Q3, and prevents false turn-on of transistor Q3. In addition, the base-emitter junction of transistor Q3 acts as a half-wave rectifier which charges up capacitor 72 with a dc voltage that maintains the base potential of transistor Q3 above the emitter potential, also to prevent a false turn-on of transistor Q3. A false turn-on of Q3 will result in the discharge of the gate-to-source parasitic capacitance $C_{gs}$ of FETs Q1 and Q2, causing switch element 12a to turn off prematurely.

Diode 74 prevents the discharge of capacitor 62 via the circuit path consisting of resistor 64, resistor 52, base-emitter junction of transistor Q3, resistor 50, resistor 70 and resistor 72 through ground via either the RF load or RF source impedance and, finally, through FET's Q1 and Q2 into the opposite terminal of capacitor 62. Likewise, diode 76 prevents the discharge of capacitor 62 via resistor 78 and a ground path, and Zener diode 66 prevents the discharge of capacitor 62 through resistor 68.

Since the gate-to-source current leakage of FETs Q1 and Q2 is typically less than $10^{-7}$A, the only significant current leakage of capacitor 62 is through FET 30, which is typically $10_{-4}$A. As previously mentioned, capacitor 62 is charged up during the switch "off" state, via resistor 63, with a current much higher than the leakage current during the "on" state.

In order to maintain the "on" state, it is necessary to refurbish capacitor 62 with current equal to the leakage current. There are many ways of refurbishing this current, as illustrated in, but not limited to, those shown in FIGS. 7 through 9.

Figure 7:
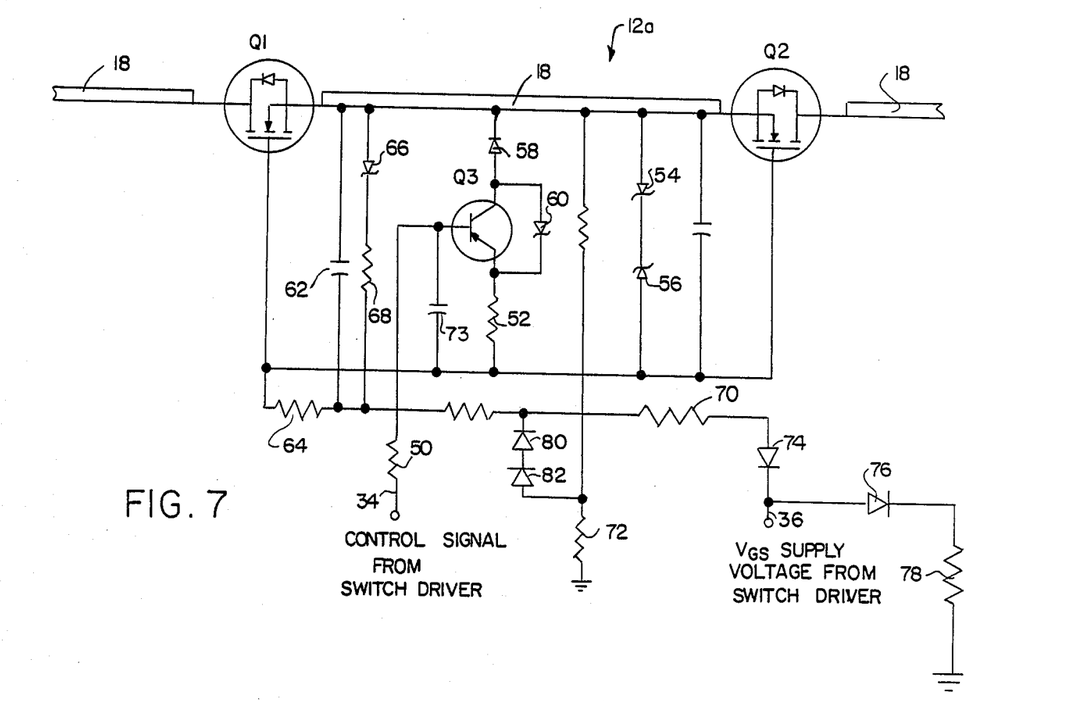
FIG. 7 shows the single-pole, single-throw switch element of FIG. 3 illustrating one form of circuit for maintaining the switch in the conductive state.

FIG. 7 shows one way of refurbishing the leakage current of capacitor 62 by using fast rectifier diodes 80 and 82 to rectify a small fraction of the power passing through the switch and charging up capacitor 62 with its rectified current. Although two diodes are shown, any number of diodes may be used consistent with the switch speed and power requirements.

Figure 8:
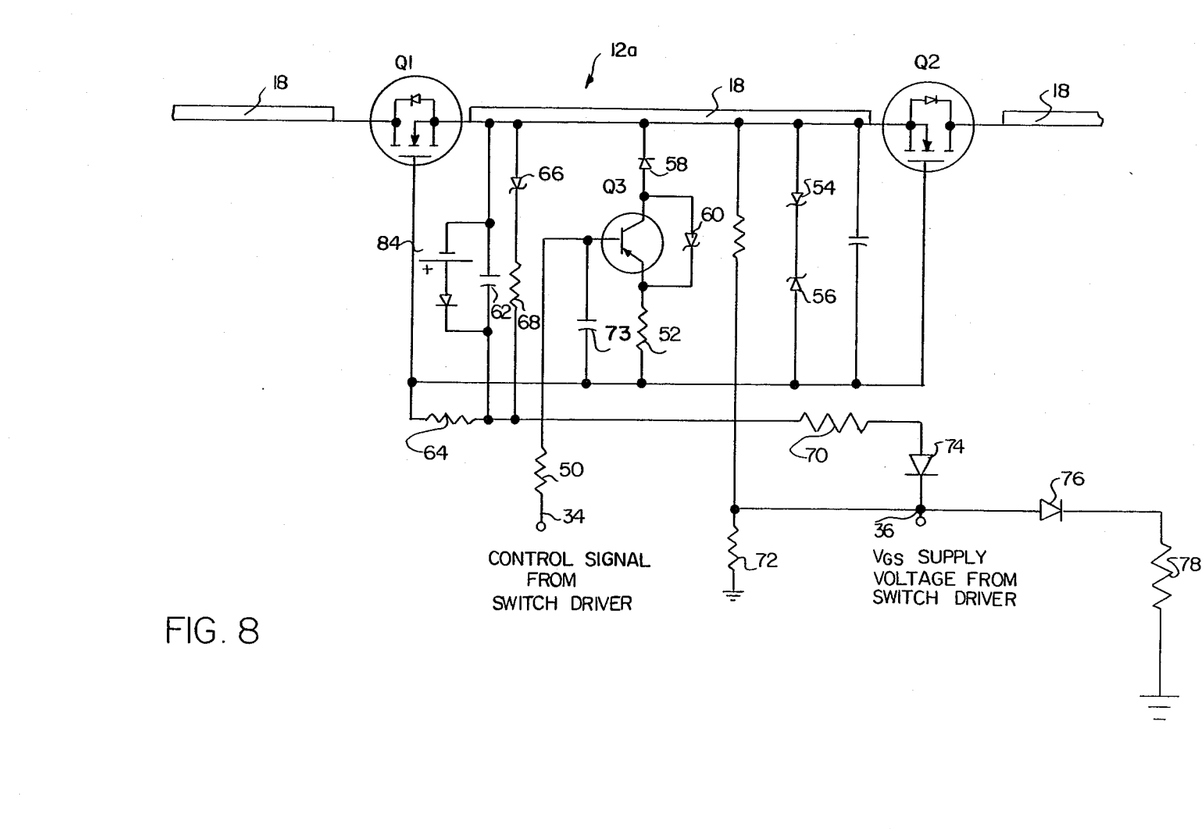
FIG. 8 shows the single-pole, single-throw switch element of FIG. 3 with a second form of circuit for maintaining the switch in the conductive state.
Figure 9:
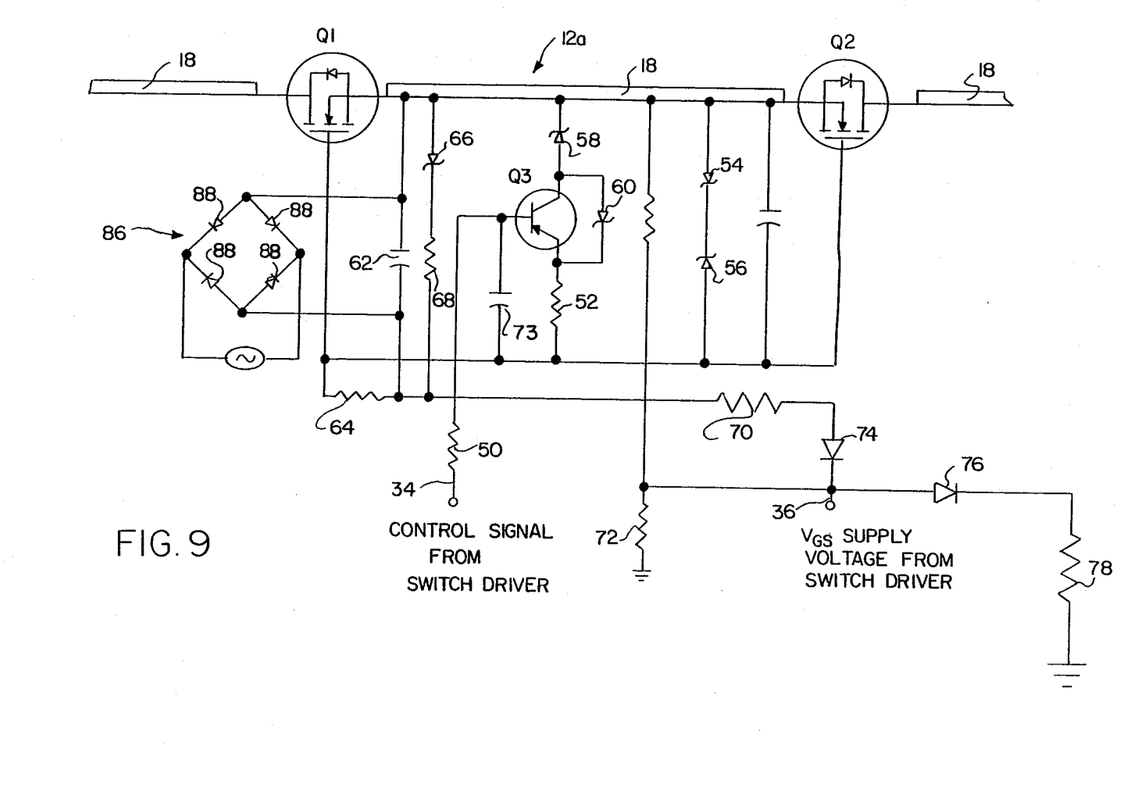
FIG. 9 shows the single-pole, single-throw switch element of FIG. 3 with a third form of circuit for maintaining the switch in the conductive state.

As shown in FIG. 8, it is also possible to charge up capacitor 62 using a small dc floating power source 84 or, as shown in FIG. 9, using a separate isolated ac source with rectifier diodes 88 to charge up capacitor 62.

In addition to rapid switching times and excellent RF isolation through the switch driver, the insertion loss and introduction of harmonics by individual single-pole, single-throw switch elements 12 can be reduced by utilizing slow reverse recovery diodes 88 and 90 (see FIG. 3) across the drain and source terminals of FETs Q1 and Q2, incorporated either as an integral part of FETs Q1 and Q2 when they are fabricated, or connected externally. As shown in FIG. 3, reverse recovery diodes 88 and 90 have their respective anodes connected to the source terminals of FETs Q1 and Q2, and their respective cathodes connected to the drain terminals of FETs Q1 and Q2.

The manner in which slow reverse recovery diodes 88 and 90 reduces insertion loss is as follows.

A forward biased diode under heavy conduction "stores" a certain amount of charge during the conduction period. Consequently, when the forward bias on the diode is changed to a reverse bias, there is a certain period of time, denoted reverse recovery time $t_{rr}$ associated with the stored reverse recovery charge $Q_{rr}$, during which time the diode will continue to conduct, but in the reverse direction. The amount of reverse recovery current $I_{rr}$ which can be conducted by the diode in the reverse direction and its duration $t_{rr}$ is a function of the frequency of the voltage applied across the diode.

Thus, it is possible to utilize the reverse recovery feature so that enough charge will be stored in diodes 88 and 90 during the forward conduction half cycle to allow complete diode conduction during the reverse half cycle.

It is possible to obtain such reverse recovery conduction in diodes 88 and 90 provided $t_{rr}$ is longer than half of the RF cycle and provided the diode can store enough charge ($Q_{rr}$) to support the reverse recovery current $I_{rr}$.

Figure 5A:
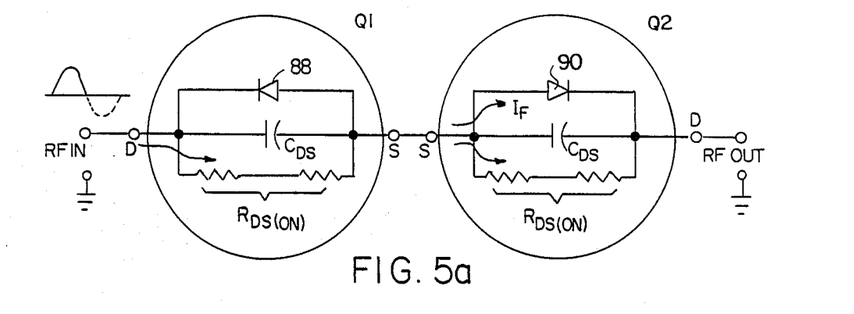
FIGS. 5a–5c are equivalent circuits of the switching elements for determining insertion loss of the switch element.

Referring now to FIG. 5(a), there is shown an equivalent circuit of FETs Q1 and Q2 in the "on" state during the positive half cycle of the RF waveform. During the first positive half cycle of the RF waveform (i.e., immediately after FETs Q1 and Q2 have first turned on), current will flow from RF IN to RF OUT through the ohmic drain to source resistance $R_{ds}$(on) of Q1. Current will then flow through Q2, where the current will divide between forward biased diode 90 and $R_{ds}$(on) of FET Q2. Because $R_{ds}$(on) is relatively high, most of the current in Q2 will flow through diode 90. Thus, diode 90 reduces the effect of ohmic resistance of Q2 and, consequently, reduces ohmic losses introduced by Q2.

Figure 5B:
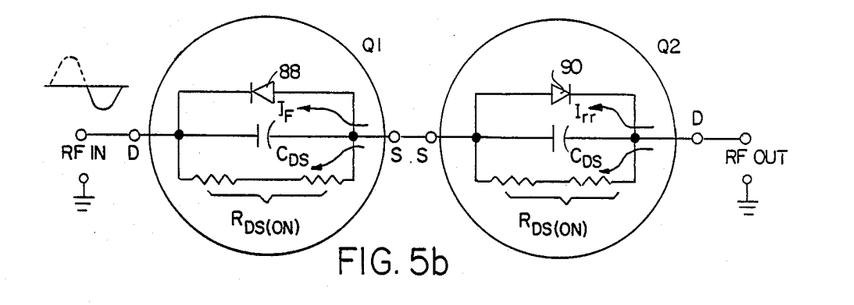

FIG. 5(b) is an equivalent circuit of FETs Q1 and Q2 for the first negative half cycle of the RF signal. During the first negative half cycle, current will flow from RF output to RF input through Q2 and Q1. However, during the first positive half cycle of the RF signal, diode 90 will have stored its reverse recovery charge $Q_{rr}$ and thus, when diode 90 becomes reverse biased during the negative half cycle of the RF signal, this charge will cause reverse recovery current $I_{rr}$ to flow through diode 90. Thus, diode 90 effectively appears to be a forward biased diode during $T_{rr}$, and thus offers a very low resistance path through Q2. At the same time, diode 88 is forward biased by the negative RF voltage, and presents a low resistance path through Q1. Because diode 88 is forward biased, diode 88 will store its reverse recovery charge $Q_{rr}$ during the negative half cycle of the RF signal so that the reverse recover charge is available for current flow in the reverse direction through diode 88 during the next positive half cycle of the RF signal.

Figure 5C:
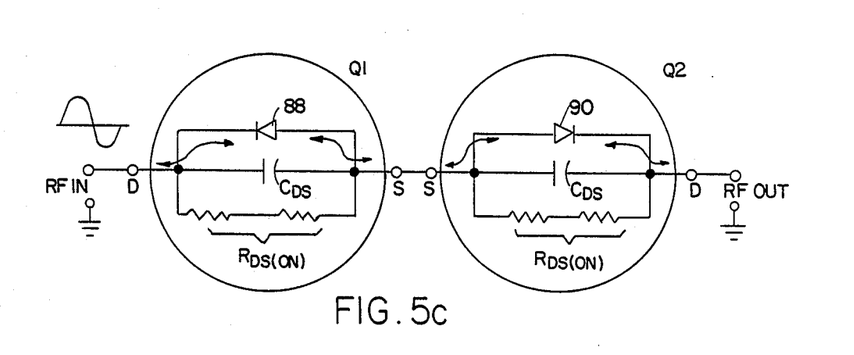

It will be appreciated that, since both diodes 88 and 90 appear as low resistances during both positive and negative RF half cycles, current flow in the steady state "on" condition will be primarily through diodes 88 and 90 during both half cycles of the RF signal, as depicted by the double-headed arrows in FIG. 5(c), which shows the steady state "on" condition.

By effectively reducing the ohmic resistance of FETs Q1 and Q2 by reverse recovery diodes 88 and 90, ohmic losses introduced by Q1 and Q2 can be reduced. It is believed that insertion losses due to Q1 and Q2 can be reduced up to tenfold by properly selecting the reverse recovery characteristics of the reverse recovery diodes 88 and 90. As just one example, it has been found that reverse recovery diodes having a reverse recovery time greater than 1 microcoulombs, at $dI_F/dt$ greater than 100 amperes per microsecond, will result in an ohmic loss level below 20 W when operating at 1500 W RF level above 1 MHz. Obviously, those skilled in the art will have no difficulty in properly selecting the characteristics of reverse recovery diodes 88 and 90 for particular switch applications.

Reducing the ohmic resistance of FETs Q1 and Q2 reduces not only insertion loss but extraneous harmonics introduced by switch elements 12. There are two major sources of harmonics in switch element 12, namely drain to source capacitance $C_{ds}$, which varies as $(1+V_{ds})^{-\frac{1}{2}}$, and the exponential characteristics of the reverse recovery diodes themselves.

Figure 6:
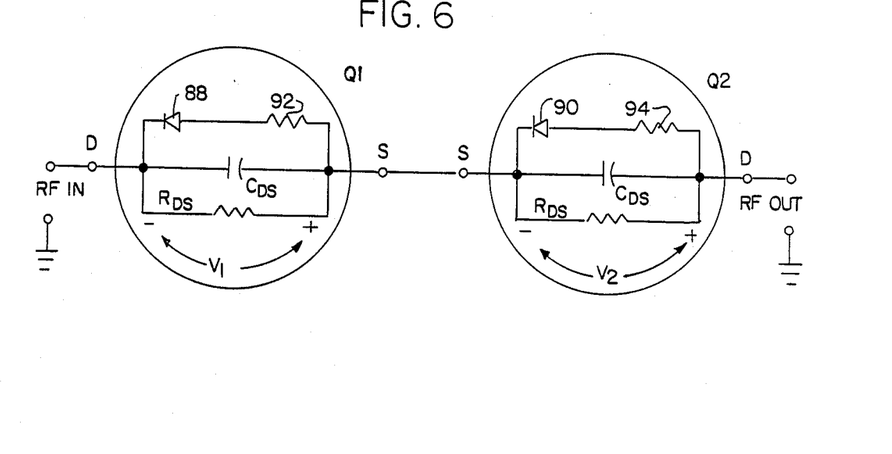
FIG. 6 is an equivalent circuit of the switching elements for determining harmonics introduced by the switch element.

FIG. 6 illustrates an equivalent circuit of FETs Q1 and Q2 in the "on" state for determining harmonic reduction. As shown in FIG. 6, each reverse recovery diode 88 and 90 has an associated ohmic equivalent resistance indicated by resistors 92 and 94. $V_1$ and $V_2$ represent the voltage across FETs Q1 and Q2 which, for an RF signal, is obviously sinusoidal. Thus, assuming a sinusoidal RF current flowing through Q1 and Q2, sinusoidal voltages $V_1$ and $V_2$ are created, which in turn varies the non-linear capacitance $C_{ds}$. Were it not for reverse recovery diodes 88 and 90, which provide a low impedance path (as already explained), voltages $V_1$ and $V_2$ would be high, resulting in a highly non-linear value of capacitance $C_{ds}$. However, because the voltages $V_1$ and $V_2$ can be made small due to the reverse recovery diodes 88 and 90, the resulting non-linearity in $C_{ds}$ is also small. As the non-linearity in $C_{ds}$ decreases, the harmonic level introduced by the non-linearity will also decrease. Fourier series analysis of the circuit can be performed by those skilled in the art if a precise mathematical description of the phenomenon is desired.

It will be appreciated that the present invention provides a high speed, high power RF switch which offers excellent isolation without the need for inductive elements, reduces insertion loss, and reduces extraneous harmonics.

Figure 10:
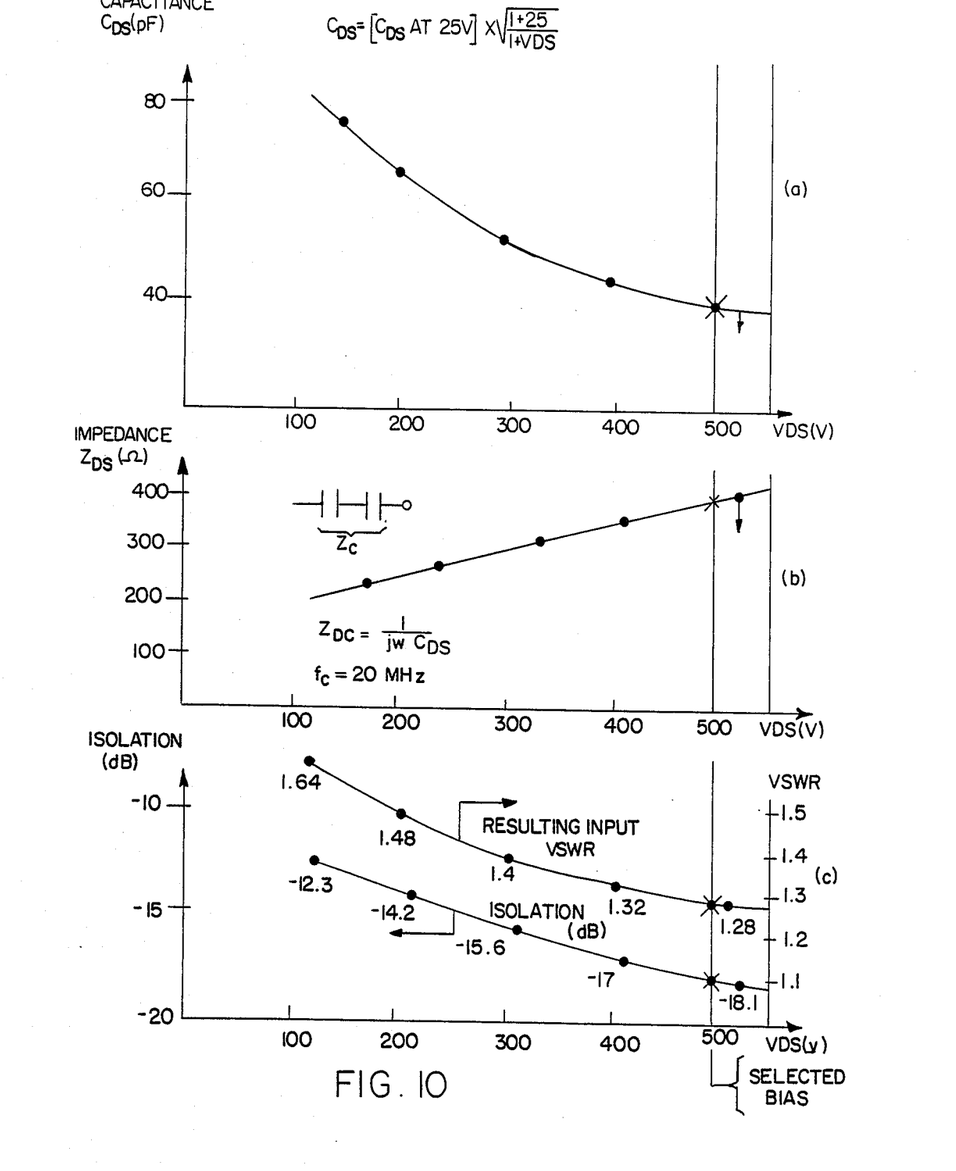
FIG. 10 is a graphical illustration of certain switch circuit parameters as a function of applied bias voltage for a fixed frequency.

In the switch "off" state, the drain-to-source capacitance $C_{ds}$ and the reverse diode junction capacitance Cj (denoted together as $C_{ds}$; see FIG. 4) dominantly establish the RF isolation. The value of $C_{ds}$ depends upon the drain-to-source bias voltage $V_{ds}$ and it varies as a function of $(1+V_{ds})^{-\frac{1}{2}}$ as shown in FIG. 10(a) (as an example only). The resulting impedance $Z_{ds}$ at f=20 MHz (i.e. $Z_{ds}=1/j2\ fC_{ds}$) is depicted in FIG. 10(b). The resulting values of isolation and input VSWR (for a shorted output) are shown in FIG. 10(c) as a function of the bias voltage $V_{ds}$. The maximum value of $V_{ds}$ is limited by the voltage breakdown of the FETs (which is limited at present to 1000 V), consisting of the dc bias voltage and the superimposed ac (RF) voltage.

The present invention may be embodied in other specific forms without departing from the spirit or essential attirbutes thereof and, accordingly, reference should be made to the appended claims, rather than to the foregoing specification, as indicating the scope of the invention.

We claim:

1. A broadband electronic switch, comprising:
   (a) first and second solid state switch means in series with a signal path for a signal to be switched, each switch means comprising a field-effect transistor having an open state and a closed state,
   (b) means electrically connected to each switch means for reducing the ohmic resistance of the switch means and signal harmonic content generated by the switch means in the closed state, and
   (c) switch control means electrically connected to each switch means for selectably placing both switch means in the open and closed states, the switch control means having non-inductive means for attenuating signal leakage from the signal path into the switch control means when the switch means are in the open state and for minimizing transition time between the switch means open and closed states, the non-inductive means comprising a bipolar transistor connected in common-emitter configuration between the source and gate terminals of the first and second switch means, the collector of the bipolar transistor being connected to a source of deep negative voltage through a third field-effect transistor having its drain electrode coupled to the base of the bipolar transistor and its source electrode connected to said source of deep negative voltage, and having its gate electrode connected to a switching signal source.

2. A broadband electronic switch, comprising:
(a) first and second field-effect transistors connected in commonsource cascade configuration defining a signal path for a signal to be switched from the drain electrode of the first transistor through the common-source connection to the drain electrode of the second transistor, each transistor having a conductive state and a non-conductive state,
(b) a reverse recovery diode connected from the source electrode to the drain electrode of each transistor, and
(c) switch control means coupled to the first and second transistors for selectably placing both transistors in the conductive and non-conductive states, the switch control means having non-inductive means for attenuating signal leakage from the signal path into the switch control means when the transistors are in the non-conductive state and for minimizing transistor parasitic capacitances during transition from the conductive to non-conductive states to minimize transition time, said non-inductive means comprising a bipolar transistor connected in common-emitter configuration between the source and gate terminals of the first and second field-effect transistors, the collector of the bipolar transistor being connected to a source of deep negative voltage through a third field-effect transistor having its drain electrode coupled to the base of the bipolar transistor and its source electrode connected to said source of deep negative voltage, and having its gate electrode connected to a switching signal source.

3. A broadband electronic switch comprising:
(a) first and second field effect transistors connected in common source cascade configuration defining a signal path for a signal to be switched from the drain electrode of the first transistor through the common source connection to the drain electrode of the second transistor, each transistor having a conductive state and a non-conductive state,
(b) a reverse recovery diode connected from the source electrode to the drain electrode of each transistor,
(c) switch control means coupled to the first and second transistors for selectably placing both transistors in the conductive and non-conductive states, the switch control means having non-inductive means for attenuating signal leakage from the signal path into the switch control means when the transistors are in the non-conductive state and for minimizing transistor parasitic capacitors during transition from the conductive to non-conductive states to minimize transition time, and
(d) circuit means to prevent false turn-off of the switch when the first and second transistors are in the conductive state.

4. A broadband electronic switch, comprising:
(a) first and second field effect transistor switch means in series with a signal path for a signal to be switched, each switch means having an open state and a closed state,
(b) means electrically connected to each switch means for reducing the ohmic resistance of the switch means and signal harmonic content generated by the switch means, said means being conductive when its associated switch is in the closed state, and
(c) switch control means electrically connected to each switch means for selectably placing both switch means in the open and closed states, the switch control means having non-inductive means for attenuating signal leakage from the signal path into the switch control means when the switch means are in the open state and for minimizing transition time between the switch means open and closed states, said non-inductive means comprising high-impedance circuit means for applying a high voltage bias to each switch means, including a bipolar transistor connected in common-emitter configuration between the source and gate terminals of the first and second field-effect transistors, the collector of the bipolar transistor being connected to a source of deep negative voltage through a third field-effect transistor.

5. A broadband electronic switch, comprising:
(a) first and second field-effect transistors connected in commonsource cascade configuration defining a signal path for a signal to be switched from the drain electrode of the first transistor through the common-source connection to the drain electrode of the second transistor, each transistor having a conductive state and a non-conductive state,
(b) a reverse recovery diode connected from the source electrode to the drain electrode of each transistor, and
(c) switch control means coupled to the first and second transistors for selectably placing both transistors in the conductive and non-conductive states, the switch control means having non-inductive means for attenuating signal leakage from the signal path into the switch control means when the transistors are in the non-conductive state and for minimizing transistor parasitic capacitances during transition from the conductive to non-conductive states to minimize transition time, said non-inductive means comprising high-impedance circuit means for applying a high-voltage bias to each field-effect transistor, including a bipolar transistor connected in common-emitter configuration between the source and gate terminals of the first and second field-effect transistors, the collector of the bipolar transistor being connected to a source of deep negative voltage through a third field-effect transistor.

* * * * *

UNITED STATES PATENT AND TRADEMARK OFFICE
CERTIFICATE OF CORRECTION

PATENT NO. : 4,808,859

DATED : February 28, 1989

INVENTOR(S) : Baruch Even-Or et al.

It is certified that error appears in the above-identified patent and that said Letters Patent is hereby corrected as shown below:

Column 5, line 66, change "72" to —73—.

Column 6, line 3, change "72" to —73—.

Signed and Sealed this

Twenty-second Day of August, 1989

Attest:

DONALD J. QUIGG

Attesting Officer

Commissioner of Patents and Trademarks

UNITED STATES PATENT AND TRADEMARK OFFICE
CERTIFICATE OF CORRECTION

PATENT NO. : 4,808,859

DATED : February 28, 1989

INVENTOR(S) : Even-or et al.

It is certified that error appears in the above-identified patent and that said Letters Patent is hereby corrected as shown below:

Cover page, after "Attorney, Agent, or Firm," "Bonda" should be —Gonda—.

Column 1, line 35, "braodband" should be —broadband—.

Column 1, line 36, "witch" should be —switch—.

Column 6, line 22, "$10_{-4}$—" should be —$10^{-4}$—.

Column 7, line 40, "recover" should be —recovery—.

Signed and Sealed this

Fifth Day of December, 1989

Attest:

JEFFREY M. SAMUELS

Attesting Officer      Acting Commissioner of Patents and Trademarks